(12) United States Patent
Kume et al.

(10) Patent No.: US 6,466,597 B1
(45) Date of Patent: Oct. 15, 2002

(54) SEMICONDUCTOR LASER DEVICE

(75) Inventors: Masahiro Kume, Shiga; Yuzaburo Ban; Kenji Harafuji, both of Osaka; Isao Kidoguchi; Satoshi Kamiyama, both of Hyogo; Ayumu Tsujimura, Osaka; Ryoko Miyanaga, Nara; Akihiko Ishibashi; Yoshiaki Hasegawa, both of Osaka, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/332,163

(22) Filed: Jun. 14, 1999

(30) Foreign Application Priority Data

Jun. 17, 1998 (JP) .......................... 10-169631

(51) Int. Cl.$^7$ .......................... G01S 5/00; H01L 29/06; H01L 31/00
(52) U.S. Cl. .......................... 372/45; 372/43; 372/44; 257/13; 257/25; 257/103
(58) Field of Search .......................... 372/45, 43, 44; 257/13, 25, 103

(56) References Cited

U.S. PATENT DOCUMENTS

| | | | | |
|---|---|---|---|---|
| 4,438,446 A | * | 3/1984 | Tsang .......................... | 257/13 |
| 4,760,579 A | * | 7/1988 | Schulman et al. .......................... | 257/25 |
| 6,118,800 A | * | 9/2000 | Kidoguchi et al. .......................... | 372/46 |
| RE37,177 E | * | 5/2001 | Ukita et al. .......................... | 372/43 |
| 6,298,077 B1 | * | 10/2001 | He .......................... | 372/45 |
| 6,307,873 B1 | * | 10/2001 | Geels et al. .......................... | 372/45 |
| 6,324,200 B1 | * | 11/2001 | Kamiyama et al. .......................... | 372/43 |
| 6,329,667 B1 | * | 12/2001 | Ota et al. .......................... | 257/103 |

FOREIGN PATENT DOCUMENTS

| | | |
|---|---|---|
| JP | 8-064870 | 3/1996 |
| JP | 10-056236 | 2/1998 |

OTHER PUBLICATIONS

Notice of Reasons of Rejection, Patent Application No.: 11-170509 Mailing No. 080959, Mailing Date: Mar. 19, 2002.

* cited by examiner

*Primary Examiner*—Paul Ip
*Assistant Examiner*—Cornelius H Jackson
(74) *Attorney, Agent, or Firm*—Nixon Peabody LLP; Donald R. Studebaker

(57) ABSTRACT

A nitride semiconductor laser device includes an n-type contact layer of n-type GaN and an n-type cladding layer of n-type $Al_{0.35}Ga_{0.65}N$ formed on a substrate of sapphire. On the n-type cladding layer, a multiple quantum well active layer of $Al_{0.2}Ga_{0.8}N/Al_{0.25}Ga_{0.75}N$, a p-type leak barrier layer of p-type $Al_{0.5}Ga_{0.5}N_{0.975}P_{0.025}$ and a p-type cladding layer of p-type $Al_{0.4}Ga_{0.6}N_{0.98}P_{0.02}$ are successively formed. The p-type leak barrier layer has a wider energy gap than the n-type cladding layer, and the p-type leak barrier layer and the p-type cladding layer include phosphorus for making an acceptor level shallow with keeping a wide energy gap.

21 Claims, 9 Drawing Sheets

SEMICONDUCTOR LASER DEVICE

BACKGROUND OF THE INVENTION

The present invention relates to a semiconductor laser device of a group III–V nitride semiconductor represented by a general formula, $Al_xGa_yIn_{1-x-y}P_vAs_wN_{1-v-w}$ (wherein $0 \leq x \leq 1$, $0 \leq y \leq 1$, $x+y \leq 1$, $0 \leq v \leq 1$, $0 \leq w \leq 1$ and $v+w \leq 1$), which shows laser action with a wavelength ranging from the blue region to the ultraviolet region and is expected to be applied to fields of optical data processing and the like.

Recently, large capacity optical disk systems such as a digital video disk system have been put to practical use, and the recording capacity of an optical disk is now being further increased. As is well known, for the purpose of increasing the recording capacity, it is one of the most effective means to shorten a wavelength of a laser beam used as a light source for recording or reproducing information. A semiconductor laser chip included in an existing digital video disk system is made from a semiconductor material mainly including AlGaInP among group III–V semiconductor materials, and has a wavelength for laser action of 650 nm. Accordingly, a laser device with a shorter wavelength using a group III–V nitride semiconductor material is indispensable for a high density digital video disk system now under development.

Now, a conventional group III–V nitride semiconductor laser device will be described with reference to a drawing.

FIG. 8 shows a sectional structure of the conventional group III–V nitride semiconductor laser device.

As is shown in FIG. 8, a buffer layer 102 of GaN and an n-type contact layer 103 of n-type GaN with low resistance are successively formed on a substrate 101 of sapphire. In an element region on the n-type contact layer 103, an n-type cladding layer 104 of AlGaN, an n-type light guiding layer 105 of n-type GaN, a multiple quantum well active layer 106 including alternately stacked well layer of $Ga_{1-x}In_xN$ and barrier layer of $Ga_{1-y}In_yN$ (wherein $0 < y \leq x < 1$), a p-type light guiding layer 107 of p-type GaN and a p-type cladding layer 108 of p-type AlGaN having a ridge stripe portion 108a in the shape of a ridge with a width of 3 through 10 μm on the top surface thereof are successively formed.

On the p-type cladding layer 108, a p-type contact layer 109 of p-type GaN with low resistance is formed, and on the p-type contact layer 109, a p-side electrode 110 is selectively formed. The top surface of the p-type cladding layer 108 on both sides of the ridge stripe portion 108a excluding the p-side electrode 110 and the side surfaces of the element region are covered with an insulating film 111. On the insulating film 111, a wire electrode 112 is formed so as to be in contact and cover the p-side electrode 110, and an n-side electrode 113 is formed on the n-type contact layer 103 on a side of the element region.

When the semiconductor laser device having the aforementioned structure is grounded at the n-side electrode 113 and supplied with a given voltage at the wire electrode 112, the semiconductor laser device shows laser action with a wavelength of 370 nm through 430 nm. This wavelength for laser action is varied depending upon the compositions and the thicknesses of the layers of $Ga_{1-x}In_xN$ and $Ga_{1-y}In_yN$ included in the multiple quantum well active layer 106. At present, continuous laser action has been achieved at a temperature exceeding room temperature and will soon be put to practical use. However, in order to increase the recording capacity of an optical disk system, a semiconductor laser device capable of showing laser action with a shorter wavelength is desired to realize.

However, in the conventional group III–V nitride semiconductor laser device, the wavelength for laser action cannot be made shorter than approximately 370 nm and is difficult to further shorten in view of the operating principle.

In order to realize a semiconductor laser with a shorter wavelength, a so-called wide gap semiconductor having a wide band gap (energy gap) is used as an active layer. For example in the aforementioned multiple quantum well active layer 106, a shorter wavelength can be attained by using, as the well layer, $Ga_{1-x}In_xN$ with the composition ratio of In of 0, namely, GaN, or AlGaN including Al for further widening the energy gap.

In a double heterostructure laser device in which carriers and produced light are confined in an active layer, a semiconductor material having a wider energy gap than the active layer is required to be used as a cladding layer.

In general, in order to obtain a semiconductor laser device having practical operation characteristics operable at room temperature or more, it is necessary to use a cladding layer having an energy gap wider than that of an active layer by at least approximately 0.4 eV. Since the energy gap of a semiconductor of AlGaN can be widely changed in a range between 3.4 eV and 6.2 eV, it is possible to form a cladding layer with a wide energy gap. However, when the semiconductor of AlGaN has a composition with a wide energy gap, p-type impurity doping for obtaining a p-type semiconductor becomes particularly difficult because the thermal activation efficiency of holes is lowered. Therefore, at present, merely a p-type semiconductor with the composition ratio of Al of approximately 0.2 at most (namely, $Al_{0.2}Ga_{0.8}N$ as a mixed crystal) and with an energy gap of approximately 4.0 eV at most can be obtained.

The present inventors have extensively examined the reason for which a p-type group III–V nitride semiconductor, particularly a semiconductor of p-type AlGaN, can merely attain an energy gap up to approximately 4.0 eV at most, resulting in reaching the following conclusion:

FIG. 9 shows energy levels of p-type gallium nitride (GaN) and p-type aluminum nitride (AlN), wherein the ordinate indicates the energy of electrons. As is shown in FIG. 9, above valence bands Ev of GaN and AlN, an acceptor level Ea derived from magnesium (Mg) working as a p-type dopant is formed. Mg is generally regarded as an acceptor that is the shallowest in a nitride semiconductor, namely, that has the lowest binding energy and can be easily activated, and hence is widely used as a p-type dopant.

However, even Mg has a comparatively high acceptor level of 0.15 eV from the energy Ev at the upper end of the valance band of GaN. As is well known, a thermal energy corresponding to room temperature is approximately 0.025 eV, and the thermal activation efficiency of Mg at room temperature is merely approximately 1%. Accordingly, in order to obtain a carrier concentration of $1 \times 10^{17}$ cm$^{-3}$ through $1 \times 10^{18}$ cm$^{-3}$ required in a p-type cladding layer, the dope concentration of Mg should be $1 \times 10^{19}$ cm$^{-3}$ through $1 \times 10^{20}$ cm$^{-3}$. The dope concentration of Mg of $1 \times 10^{20}$ cm$^{-3}$ approximates to a limit for obtaining a good semiconductor crystal, and when Mg is further doped, the crystallinity becomes very poor. Accordingly, with a carrier concentration attained by the impurity concentration of $1 \times 10^{20}$ cm$^{-3}$ regarded as a limit of the dope concentration, it is necessary to attain a thermal activation efficiency of the acceptor of 0.1% or more in order to obtain a carrier concentration exceeding $1 \times 10^{17}$ cm$^{-3}$.

On the other hand, as is shown in FIG. 9, the acceptor level Ea of Mg is deeper in AlN, and reaches approximately 0.6 eV. For example, in $Al_yGa_{1-y}N$, the acceptor level is substantially linearly changed from 0.15 eV to 0.6 eV by changing the composition ratio y of Al. In order to attain the thermal activation efficiency of the acceptor of 0.1% or more, it is necessary to make comparatively small a difference between the acceptor level Ea and the energy Ev at the upper end of the valence band, and hence, the composition ratio y of Al cannot be increased.

When the composition ratio of Al cannot be thus increased, the proportion of electrons that are not recombined with holes but leak to the p-type cladding layer becomes large among the electrons injected from the n-type cladding layer into the active layer. As a result, the proportion of holes that leak to the n-type cladding layer becomes large among the holes injected from the p-type cladding layer into the active layer. Such a leakage current does not contribute to laser action, and hence increases a threshold current for laser action. Furthermore, when a semiconductor laser device is operated at a high temperature, the proportions of the electrons and holes leaking from the active layer are further increased. Therefore, the threshold current is largely increased in accordance with increase of the temperature, resulting in degrading the temperature characteristic of the semiconductor laser device.

Moreover, when a crystal having a large composition ratio of Al is stacked on a crystal having a small composition ratio of Al, a stress is caused due to a difference in the lattice constant therebetween. In particular, such a stress can cause a crack in a cladding layer required to have a thickness of 1 $\mu m$ or more, resulting in degrading the laser characteristic and the reliability.

SUMMARY OF THE INVENTION

In consideration of the aforementioned conventional problems, an object of the invention is realizing a semiconductor laser device that has a low threshold current even in the ultraviolet region and has an excellent temperature characteristic.

In order to achieve the object, the nitride semiconductor laser device of this invention includes a p-type barrier layer formed between an active layer and a p-type cladding layer for preventing electrons from leaking from an n-type cladding layer to the p-type cladding layer, and an n-type barrier layer formed between the active layer and the n-type cladding layer for preventing holes from leaking from the p-type cladding layer to the n-type cladding layer.

Specifically, the first semiconductor laser device of this invention comprises an n-type cladding layer of an n-type first nitride semiconductor formed on a substrate; an active layer, formed on the n-type cladding layer, of a second nitride semiconductor having a narrower band gap than the first nitride semiconductor; a p-type cladding layer, formed on the active layer, of a p-type third nitride semiconductor having a wider band gap than the second nitride semiconductor; and a p-type barrier layer, formed between the active layer and the p-type cladding layer, of a p-type fourth nitride semiconductor having a wider band gap than the first nitride semiconductor.

In general, when the wavelength for laser action ranges over the ultraviolet region, the n-type cladding layer is required to have a band gap (energy gap) of at least approximately 4.4 eV. Therefore, in electrons injected from the n-type cladding layer into the active layer, the amount of electrons not injected into the active layer having a smaller thickness than the cladding layer but leaking to the p-type cladding layer is increased. However, since the first semiconductor laser device comprises the p-type barrier layer having a wider band gap than the n-type cladding layer and formed between the active layer and the p-type cladding layer, the electrons that are otherwise not injected into the active layer but leak to the p-type cladding layer can be effectively injected into the active layer. Accordingly, the threshold current does not increase, resulting in attaining an excellent operation characteristic.

The second semiconductor laser device of this invention comprises a p-type cladding layer of a p-type first nitride semiconductor formed on a substrate; an active layer, formed on the p-type cladding layer, of a second nitride semiconductor having a narrower band gap than the first nitride semiconductor; an n-type cladding layer, formed on the active layer, of an n-type third nitride semiconductor having a wider band gap than the second nitride semiconductor; and a p-type barrier layer, formed between the p-type cladding layer and the active layer, of a p-type fourth nitride semiconductor having a wider band gap than the third nitride semiconductor.

Although the second semiconductor laser device includes the p-type cladding layer formed on a surface of the active layer closer to the substrate, the p-type barrier layer having a wider band gap than the n-type cladding layer is formed between the p-type cladding layer and the active layer. Therefore, the electrons otherwise leaking to the p-type cladding layer can be effectively injected into the active layer as in the first semiconductor laser device.

In the first or second semiconductor laser device, the p-type cladding layer preferably includes phosphorus or arsenic. In this manner, even when the p-type cladding layer includes aluminum (Al) in a comparatively large amount for widening the band gap, a difference between an energy at the upper end of the valence band and an energy of the acceptor level can be prevented from increasing in the p-type cladding layer with keeping a wide energy gap of the p-type cladding layer. In other words, the acceptor level of the p-type cladding layer can thus be lowered, and hence, the p-type cladding layer can be doped with a p-type dopant in a desired manner. As a result, the p-type cladding layer can attain a band gap sufficiently wide to be applied to the active layer having a band gap capable of emitting violet light.

In this case, the p-type cladding layer preferably has a composition for attaining a lattice constant substantially according with a lattice constant of gallium nitride, a lattice constant of a nitride semiconductor layer formed on a surface of the active layer closer to the substrate or a lattice constant of the substrate. In this manner, even when the p-type cladding layer includes Al in a comparatively large amount for widening the band gap, the lattice constant of the p-type cladding layer can be prevented from reducing. As a result, the crystallinity of the p-type cladding layer required to have a comparatively large thickness can be improved.

In the first or second semiconductor laser device, the p-type barrier layer preferably includes phosphorus or arsenic. In so doing, the energy at the upper end of the valence band and the energy at the lower end of the conduction band in the p-type barrier layer shift upward, so that a potential barrier to the hole is further reduced, with a result of efficient injection of the holes to the active layer.

In this case, the p-type barrier layer preferably has a composition for attaining a lattice constant substantially according with a lattice constant of gallium nitride, a lattice constant of a nitride semiconductor layer formed on a surface of the active layer closer to the substrate or a lattice constant of the substrate.

In the first or second semiconductor laser device, the p-type barrier layer preferably has a thickness of 1 nm or more and 100 nm or less. Thus, the p-type layer can be in a thickness for decreasing a tunnel probability of electrons without decreasing a tunnel probability of holes.

In the first or second semiconductor laser device, the active layer and the p-type barrier layer are preferably adjacent to each other. When the p-type barrier layer and the active layer are adjacent to each other, the p-type barrier layer can definitely work as an energy barrier against the electrons injected from the n-type cladding layer but not injected into the active layer.

The first or second semiconductor laser device preferably further comprises, between the p-type barrier layer and the p-type cladding layer, a p-type carrier injection layer of a p-type fifth nitride semiconductor having a band gap wider than the band gap of the active layer and narrower than the band gap of the p-type cladding layer. In this manner, holes having comparatively high energy injected from the p-type active layer once drop into the p-type carrier injection layer having a narrower band gap than the p-type cladding layer, so as to slightly reduce their energy, and the holes are then injected into the active layer. Accordingly, the efficiency of injecting holes into the active layer can be improved, resulting in further improving the operation characteristic of the laser device.

In this case, the p-type carrier injection layer preferably includes phosphorus or arsenic.

Furthermore, in this case, the p-type carrier injection layer preferably has a composition for attaining a lattice constant substantially according with a lattice constant of gallium nitride, a lattice constant of a nitride semiconductor layer formed on a surface of the active layer closer to the substrate or a lattice constant of the substrate.

Moreover, the active layer and the p-type barrier layer are preferably adjacent to each other, and the p-type barrier layer and the p-type carrier injection layer are preferably adjacent to each other.

The third semiconductor laser device of this invention comprises an n-type cladding layer of an n-type first nitride semiconductor formed on a substrate; an active layer, formed on the n-type cladding layer, of a second nitride semiconductor having a narrower band gap than the first nitride semiconductor; a p-type cladding layer, formed on the active layer, of a p-type third nitride semiconductor having a wider band gap than the second nitride semiconductor; an n-type barrier layer having a wider band gap than the third nitride semiconductor and formed between the n-type cladding layer and the active layer; an n-type carrier injection layer having a band gap narrower than the band gap of the first nitride semiconductor and wider than the band gap of the second nitride semiconductor and formed between the n-type cladding layer and the n-type barrier layer; a p-type barrier layer having a wider band gap than the first nitride semiconductor and formed between the active layer and the p-type cladding layer; and a p-type carrier injection layer having a band gap narrower than the band gap of the third nitride semiconductor and wider than the band gap of the second nitride semiconductor and formed between the p-type barrier layer and the p-type cladding layer.

The third semiconductor laser device includes, in addition to the p-type barrier layer for reflecting electrons injected from the n-type cladding layer on a side of the p-type cladding layer, the n-type barrier layer for reflecting holes injected from the p-type cladding layer on a side of the n-type cladding layer. The third semiconductor laser device further includes the p-type carrier injection layer for improving the efficiency of injecting holes into the active layer formed between the p-type barrier layer and the p-type cladding layer, and the n-type carrier injection layer for improving the efficiency of injecting electrons into the active layer formed between the n-type barrier layer and the n-type cladding layer. Accordingly, the threshold current can be prevented from increasing, resulting in stably emitting a laser beam with a short wavelength ranging over the ultraviolet region.

In the third semiconductor laser device, at least one of the n-type cladding layer and the p-type cladding layer preferably includes phosphorus or arsenic.

In this case, at least one of the n-type cladding layer and the p-type cladding layer preferably has a composition for attaining a lattice constant substantially according with a lattice constant of gallium nitride, a lattice constant of a nitride semiconductor layer formed on a surface of the active layer closer to the substrate or a lattice constant of the substrate.

In the third semiconductor laser device, at least one of the n-type barrier layer and the p-type barrier layer preferably includes phosphorus or arsenic.

In this case, at least one of the n-type barrier layer and the p-type barrier layer preferably has a composition for attaining a lattice constant substantially according with a lattice constant of gallium nitride, a lattice constant of a nitride semiconductor layer formed on a surface of the active layer closer to the substrate or a lattice constant of the substrate.

In the third semiconductor laser device, each of the n-type barrier layer and the p-type barrier layer preferably has a thickness of 1 nm or more and 100 nm or less.

In this case, at least one of the n-type carrier injection layer and the p-type carrier injection layer preferably includes phosphorus or arsenic.

In this case, at least one of the n-type carrier injection layer and the p-type carrier injection layer preferably has a composition for attaining a lattice constant substantially according with a lattice constant of gallium nitride, a lattice constant of a nitride semiconductor layer formed on a surface of the active layer closer to the substrate or a lattice constant of the substrate.

In the third semiconductor laser device, the active layer and the n-type barrier layer are preferably adjacent to each other, and the n-type barrier layer and the n-type carrier injection layer are preferably adjacent to each other.

In the third semiconductor laser device, the active layer and the p-type barrier layer are preferably adjacent to each other, and the p-type barrier layer and the p-type carrier injection layer are preferably adjacent to each other.

DETAILED DESCRIPTION OF THE INVENTION

Embodiment 1

Embodiment 1 of the invention will now be described with reference to the accompanying drawings.

Figure 1:
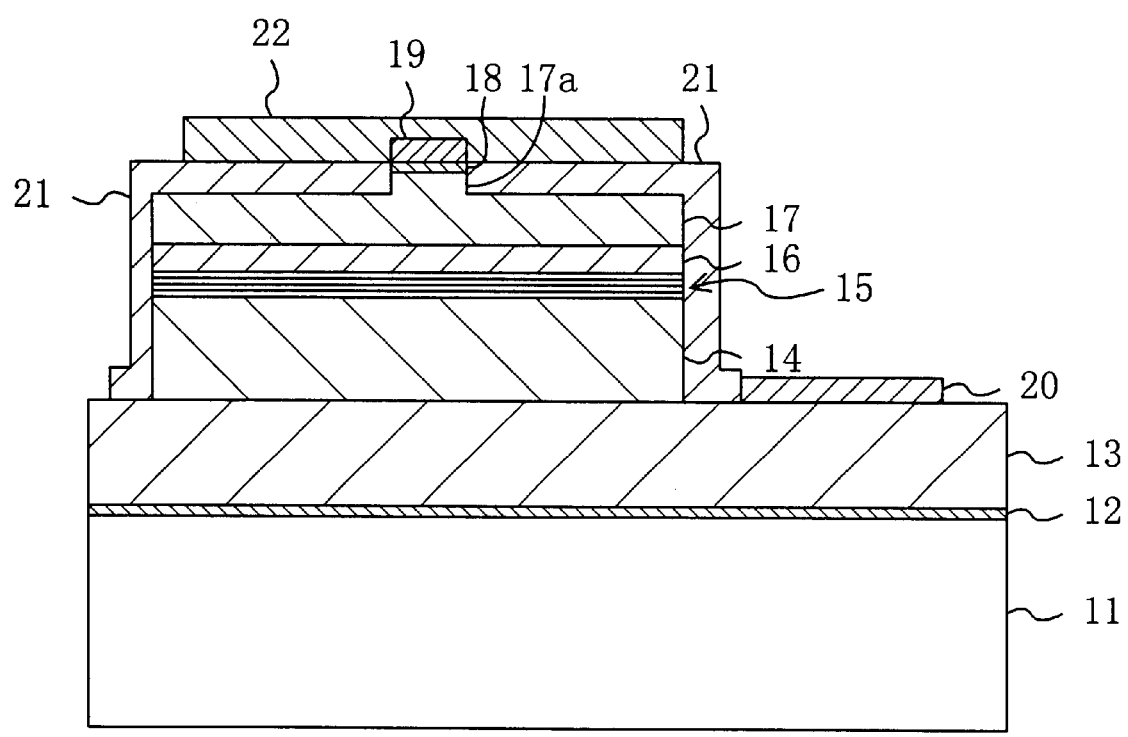
FIG. 1 is a sectional view of the structure of a semiconductor laser device according to Embodiment 1 of the invention.

FIG. 1 shows the sectional structure of a multiple quantum well type nitride semiconductor laser device according to Embodiment 1. Herein, the structure of the laser device will be described by describing a method of forming respective semiconductor layers constituting a double heterostructure.

First, as is shown in FIG. 1, on a substrate 11 of sapphire having the (0001) surface orientation, a buffer layer 12 of GaN for obtaining a semiconductor layer including few crystal defects by relaxing mismatch in the lattice constant between the substrate 11 and a nitride semiconductor crystal to be grown on the substrate 11; an n-type contact layer 13 of n-type GaN with low resistance including Si as an n-type dopant; and n-type cladding layer 14 of n-type $Al_{0.35}Ga_{0.65}N$ for confining electrons and produced light in an active layer described below are successively grown by using the metal organic vapor phase epitaxial growth method (MOVPE).

Subsequently, on the n-type cladding layer 14, a quantum well layer of $Al_{0.2}Ga_{0.8}N$ and a barrier layer of $Al_{0.25}Ga_{0.75}N$ are alternately stacked approximately three times, thereby forming a multiple quantum well active layer 15 for producing light through recombination of confined electrons and holes.

Next, on the multiple quantum well active layer 15, a p-type leak barrier layer 16 of p-type $Al_{0.5}Ga_{0.5}N_{0.975}P_{0.025}$ having a thickness of approximately 20 nm, including Mg as a p-type dopant and serving as a potential barrier against electrons injected from the n-type cladding layer 14; a p-type cladding layer 17 of p-type $Al_{0.4}Ga_{0.6}N_{0.98}P_{0.02}$ for confining holes and produced light in the quantum well active layer 15; and a p-type contact layer 18 of p-type GaN with low resistance are successively grown.

In this manner, epitaxial layers having a double heterostructure in which the p-type leak barrier layer 16 having a wider energy gap than the n-type cladding layer 14 and including phosphorus (P) is formed between the multiple quantum well active layer 15 and the p-type cladding layer 17 including phosphorus (P) are formed.

After forming the epitaxial layers, the p-type contact layer 18 and an element region in the p-type cladding layer 17 are selectively dry etched. Thus, a ridge stripe portion 17a in the shape of a ridge with a width of approximately 5 μm having the p-type contact layer 18 on the top surface thereof is formed on the p-type cladding layer 17.

Then, on the p-type contact layer 18, a p-side electrode 19 of a stacked substance including Ni and Au is selectively formed. Thereafter, dry etching is carried out until the n-type contact layer 13 is exposed with the element region of the epitaxial layers covered with a mask, thereby forming an n-side electrode forming region on the n-type contact layer 13. Next, an n-type electrode 20 of a stacked substance including Ti and Al is selectively formed in the n-side electrode forming region on the n-type contact layer 13.

Next, a protecting insulating film 21 of a silicon oxide film or the like is formed on parts of the p-type cladding layer 17 on both sides of the ridge stripe portion 17a and on the side surfaces of the element region.

Subsequently, a wire electrode 22 to be electrically connected with the p-side electrode 19 is formed in an area including the p-side electrode 19 on the protecting insulating film 21. In this manner, the nitride semiconductor laser device of FIG. 1 is obtained.

The operation and the operation characteristic of the semiconductor laser device having the aforementioned structure will now be described with reference to the drawings.

In the semiconductor laser device of this embodiment, the multiple quantum well active layer 15 has an effective energy gap of approximately 4 eV. Therefore, when the n-side electrode 20 is grounded and the wire electrode 22 is supplied with a given voltage, holes and electrons are injected into the quantum well active layer 15 from the p-side electrode 19 and the n-side electrode 20, respectively. Thus, an optical gain is obtained in the quantum well active layer 15, so as to show laser action with a wavelength of approximately 310 nm.

This operation will be described with reference to an energy band diagram of FIG. 2.

Figure 2:
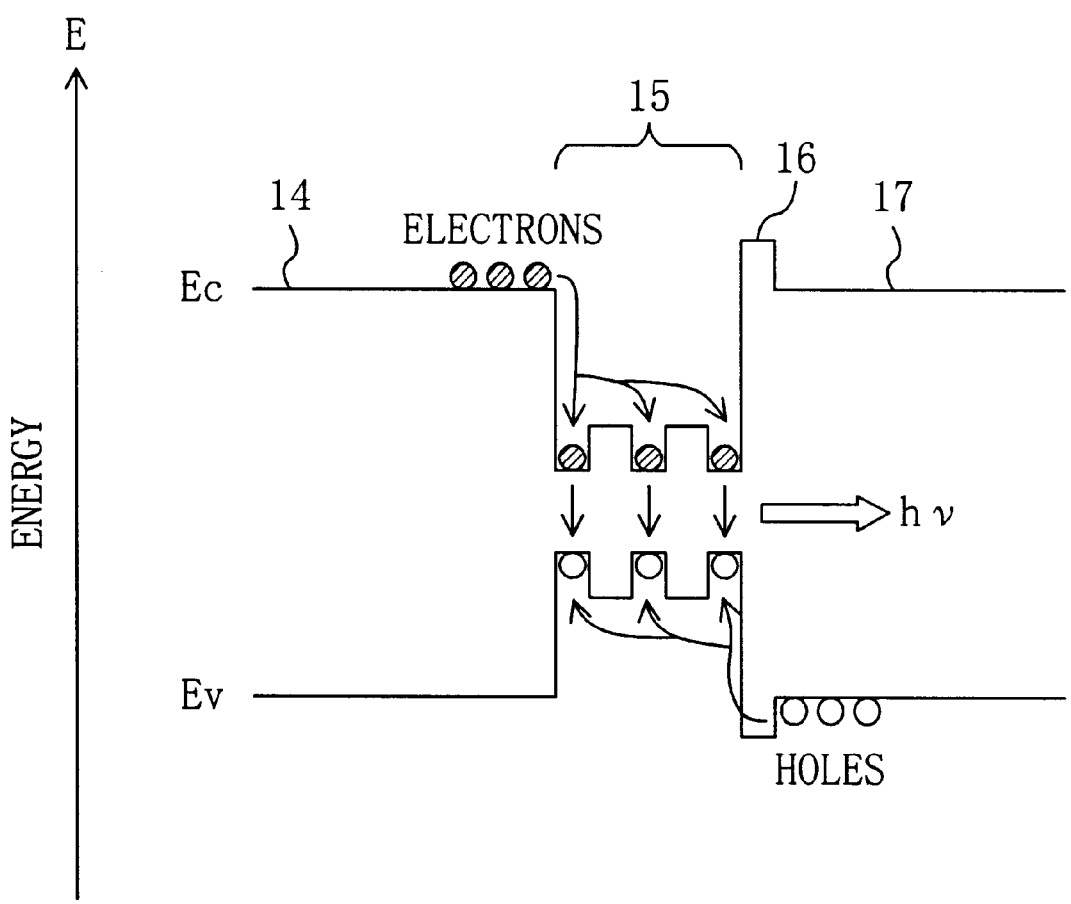
FIG. 2 is a diagram for showing an energy band in the vicinity of an active layer in the semiconductor laser device of Embodiment 1.

FIG. 2 schematically shows an energy band in the vicinity of the active layer of the semiconductor laser device of this embodiment. In FIG. 2, Ec indicates an energy at the lower end of the conduction band of electrons, and Ev indicates an energy at the upper end of the valence band of electrons. As is shown in FIG. 2, electrons injected from the n-type cladding layer 14 into the multiple quantum well active layer 15 are recombined with holes injected from the p-type cladding layer 17 in the quantum well active layer 15, resulting in producing recombination light having a photon energy hv.

Figure 3:
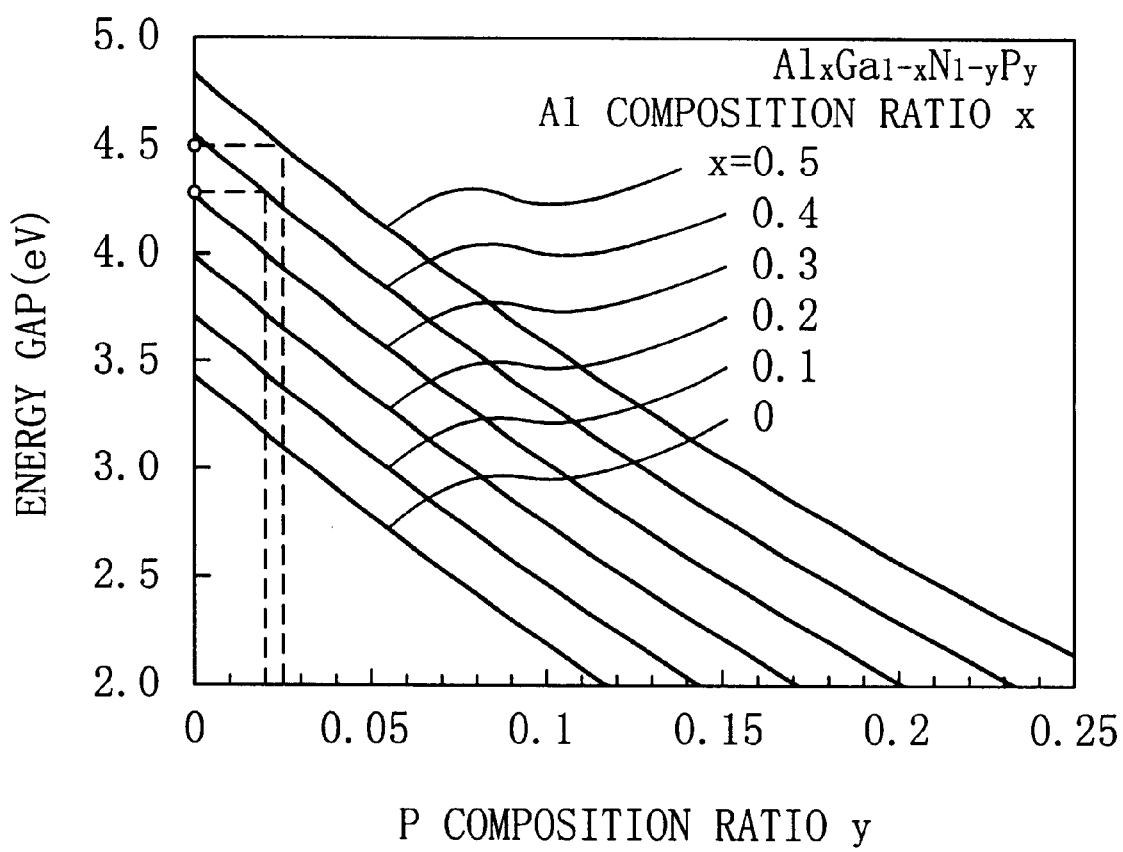
FIG. 3 is a graph for showing the relationship between composition ratios of Al and P and an energy gap in a nitride semiconductor of AlGaNP included in the semiconductor laser device of Embodiment 1.

FIG. 3 shows the relationship between composition ratios of Al and P and an energy gap in the nitride semiconductor of AlGaNP included in the semiconductor laser device of this embodiment. As is shown in FIG. 3, the p-type cladding layer 17 of $Al_{0.4}$Ga N P has an energy gap of approximately 4.4 eV, and the p-type leak Barrier layer 16 of $Al_{0.5}$Ga N P has an energy gap of approximately 4.5 eV.

In this manner, since the p-type leak barrier layer 16 having a wider energy gap than the p-type cladding layer 17 is formed between the quantum well active layer 15 and the p-type cladding layer 17 in this embodiment, the proportion of electrons injected from the n-type cladding layer 14 into the quantum well active layer 15 is increased. As a result, the threshold current can be prevented from increasing due to a leakage current caused by leaked electrons, while showing laser action with the wavelength in the ultraviolet region, and hence, the laser beam output operation can be stabilized.

In this case, as is shown in FIG. 2, it is necessary to transmit the holes injected from the p-type cladding layer 17 through the p-type leak barrier layer 16 by the tunnel effect. Therefore, the p-type leak barrier layer 16 has a thickness selected in a range that can reflect electrons but transmit holes, and the thickness is specifically 1 nm or more and 100 nm or less, and more preferably, 10 nm or more and 30 nm or less.

Next, the carrier concentrations in the n-type cladding layer 14 and the p-type cladding layer 17 including Al at a comparatively large composition ratio will be described.

First, in the n-type cladding layer 14, a carrier concentration of approximately $1 \times 10^{18}$ cm can be attained by doping, with Si, a semiconductor layer having a composition of $Al_{0.35}Ga_{0.65}N$. Therefore, there arises no problem.

Next, in the p-type cladding layer 17, in order to shorten the wavelength of a laser beam to approximately that of ultraviolet light, there is a trade-off relationship as described above that while the composition ratio of Al in a nitride semiconductor is required to be increased, a p-type semiconductor layer is difficult to form when the composition ratio of Al is increased.

Accordingly, in the semiconductor laser device of this embodiment, phosphorus or arsenic is included in the composition of the p-type semiconductor layer, so that the thermal activation efficiency of the p-type dopant can be improved with keeping a wide energy gap of the p-type cladding layer 17 of FIG. 1. This will be described with reference to the drawings.

The p-type cladding layer 17 of this embodiment has a composition of $Al_{0.4}Ga_{0.6}N_{0.98}P_{0.02}$, and Mg serving as the p-type dopant has an acceptor level of 0.15 eV that is substantially the same as the acceptor level of GaN.

The reason for which the semiconductor layer including Al at a composition ratio of 0.4 can thus attain the acceptor level substantially the same as that of GaN will now be described with reference to FIG. 4.

Figure 4:
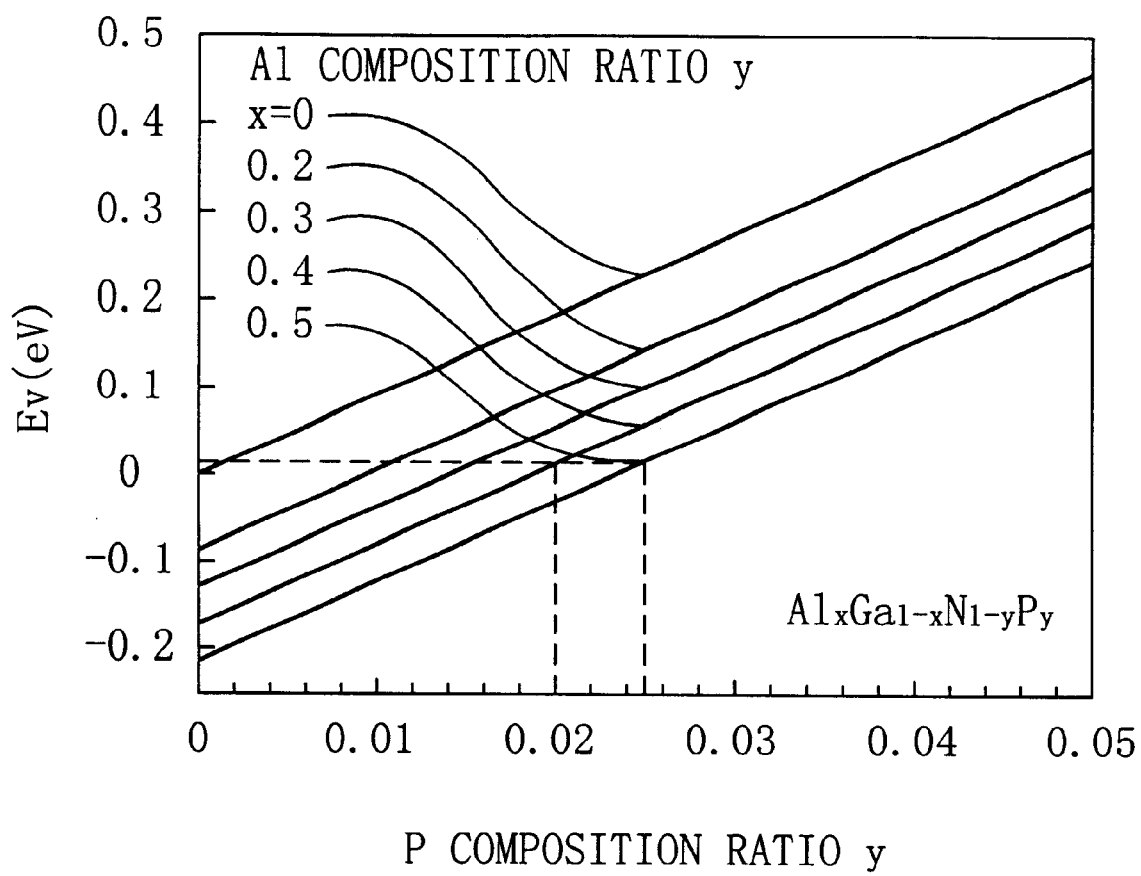
FIG. 4 is a graph for showing the relationship between the composition ratios of Al and P and an energy at the upper end of a valence band in the nitride semiconductor of AlGaNP included in the semiconductor laser device of Embodiment 1.

FIG. 4 shows the relationship, calculated on the basis of Vegard's rule, between the composition ratios of Al and P in the nitride semiconductor of AlGaNP included in the semiconductor laser device of this embodiment and the energy Ev at the upper end of the valence band. In FIG. 4, 0 eV on the ordinate corresponds to an energy Ev at the upper end of the valence band attained when the composition ratio x of Al and the composition ratio y of P are both 0, namely, in a GaN crystal.

The thermal activation efficiency p of a hole can be very simply represented as follows:

$$p = exp\{-(Ea-Ev)/kT\}$$

wherein Ea indicates an energy of an acceptor level, Ev indicates an energy at the upper end of a valence band, k indicates Boltzmann constant, and T indicates an absolute temperature. Actually, the thermal activation efficiency is represented by a more complicated expression, but when a difference (=Ea−Ev) between the energy Ea of the acceptor level and the energy Ev at the upper end of the valence band becomes larger, the thermal activation efficiency p of a p-type dopant is abruptly lowered in either case.

Figure 9:
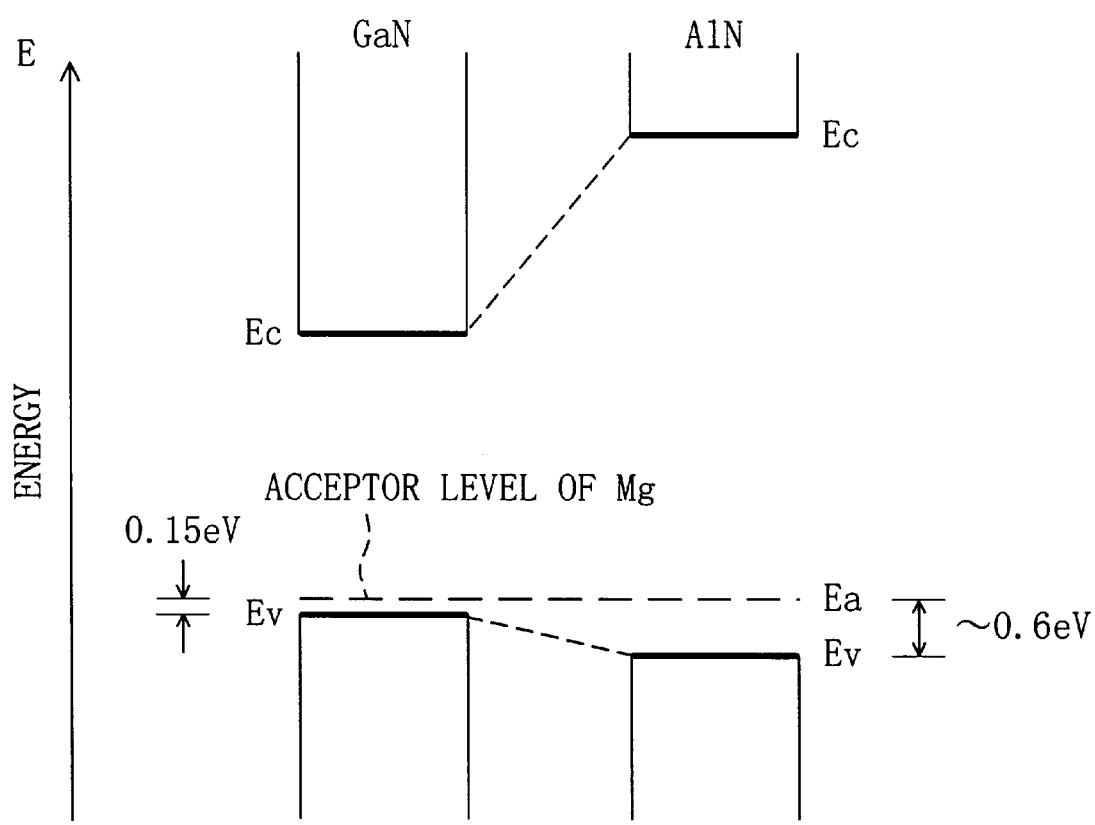
FIG. 9 is a diagram for showing energy levels of p-type gallium nitride and p-type aluminum nitride.

FIG. 4 reveals that when the composition ratio y of P in $Al_xGa_{1-x}N_{1-y}P_y$ is 0, namely, when a mixed crystal of AlGaN is used as the p-type cladding layer 17, the energy Ev at the upper end of the valence band decreases as the composition ratio x of Al is increased. Therefore, as is shown in FIG. 9, the acceptor level hardly changes, and hence, an impurity depth corresponding to the difference between the energy Ea of the acceptor level and the energy Ev at the upper end of the valence band is increased.

However, as is shown in FIG. 4, when phosphorus (P) is added as a group V element, the energy Ev at the upper end of the valence band is shifted to be higher. Therefore, the difference between the energy Ea of the acceptor level and the energy Ev at the upper end of the valence band is decreased (i.e., the acceptor level be comes, so to speak, shallower).

In this manner, the acceptor level can be made as shallow as that of gallium nitride (GaN) by adding an appropriate amount of phosphorus (P) to a nitride semiconductor in which the acceptor level is made deeper and the thermal activation efficiency of the acceptor is lowered by adding aluminum (Al) As a result, a desired p-type carrier density can be attained.

As is shown in FIG. 3, as the composition ratio of phosphorus (P) is increased, the energy gap becomes narrower. Therefore, in order t o secure an energy gap corresponding to a desired laser beam, it is necessary to increase not only the composition ratio of phosphorus (P) but also the composition ratio of aluminum (Al). Also in this case, a wide energy gap can be secured with the acceptor level kept shallow (namely, with the difference between the energies Ea and Ev kept small).

Also, there is no need for the n-type cladding layer 14 to include phosphorus (P). However, when a wavelength for laser action ranging over the violet and blue regions is desired, there is no need to increase as the composition ratio x of Al to 0.4, and hence, the n-type cladding layer 14 can be easily formed, in consideration of material supply for a crystal growth system, when the n-type cladding layer 14 uses a quaternary mixed crystal including phosphorus (P) like the p-type cladding layer 17.

The energy gap and the acceptor level of the p-type cladding layer 17 of the semiconductor laser device have been described so far, and the semiconductor laser device of this embodiment is also characterized by crystallinity sufficiently good for stably outputting a laser beam with a short wavelength ranging over the ultraviolet region.

The reason for this good crystallinity will now be described with reference to FIG. 5.

Figure 5:
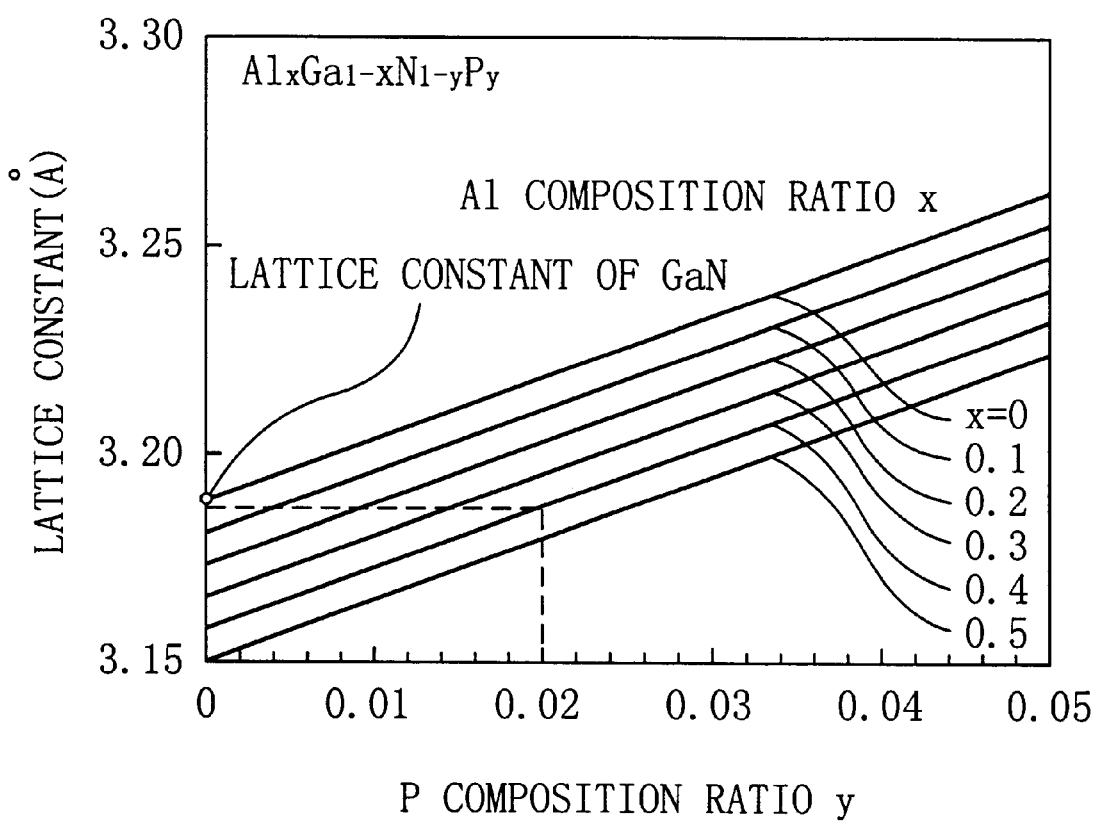
FIG. 5 is a graph for showing the relationship between the composition ratios of Al and P and a lattice constant in the nitride semiconductor of AlGaNP included in the semiconductor laser device of Embodiment 1.

FIG. 5 shows the relationship between the composition ratios of Al and P and the lattice constant in the nitride semiconductor of AlGaNP included in the semiconductor laser device of this embodiment. In FIG. 5, a white circle on the ordinate corresponds to a lattice constant attained when the composition ratio x of Al and the composition ratio of y of P are both 0, namely, the lattice constant of GaN crystal. As is shown in FIG. 5, since the composition ratio of Al is 0.4 and the composition ratio of P is 0.02 in the p-type cladding layer 17 of the semiconductor laser device of this embodiment, the lattice constant of the p-type cladding layer 17 substantially accords with the lattice constant of GaN crystal, that is, 3.19 Å. Similarly, since the composition ratio of Al is 0.5 and the composition ratio of P is 0.025 in the p-type leak barrier layer 16, the lattice constant of the p-type leak barrier layer 16 substantially accords with the lattice constant of GaN crystal.

Accordingly, since the p-type leak barrier layer 16 and the p-type cladding layer 17 have substantially the same lattice constant as GaN, the lattice constant of the crystal of the n-type contact layer 13 of GaN is dominant in growing the crystal. Therefore, no stress is caused between the multiple quantum well active layer 15 and the p-type leak barrier layer 16 and between the p-type leak barrier layer 16 and the p-type cladding layer 17. As a result, lattice defects such as a crack can be suppressed from being caused, so as to obtain a high quality semiconductor crystal. In particular, since the p-type cladding layer 17 is required to have a comparatively large thickness of approximately 1 μm, the effect of making its lattice constant substantially accord with the lattice constant of GaN is very significant.

Also, since the n-type cladding layer 14 of n-type $Al_{0.35}Ga_{0.65}N$ has a thickness exceeding 1 μm, in consideration of the crystallinity, the lattice constant of the p-type leak barrier layer 16 or the p-type cladding layer 17 can be made to accord with the lattice constant of the n-type cladding layer 14. In this case, as is shown in FIG. 5, since the composition ratio of Al is 0.35 and the composition ratio of P is 0 in the p-type cladding layer 17, the lattice constant thereof is approximately 3.17. Accordingly, the composition ratio y of P in the p-type leak barrier layer 16 with the composition ratio x of Al of 0.5 is set at approximately 0.013, and the composition ratio y of P in the p-type cladding layer 17 with the composition ratio x of Al of 0.4 is set at approximately 0.008.

Furthermore, although the substrate 11 is made from sapphire in this embodiment, when a substrate having a lattice constant approximate to that of GaN, such as silicon carbide (SiC), is used, the lattice constant of the p-type leak barrier layer 16 or the p-type cladding layer 17 can be made to substantially accord with the lattice constant of the substrate.

Also, the semiconductor laser device that uses $Al_{0.2}Ga_{0.8}N/Al\ Ga\ N$ as the multiple quantum well active layer 15 and shows laser action with a wavelength of 310 nm is described in this embodiment, which does not limit the invention. When the invention is applied to a nitride semiconductor laser device that uses $In_xGa_{1-x}N/In_yGa_{1-y}N$, $In_xGa_{1-x}N/GaN$, $In_xGa_{1-x}N/Al_yGa_{1-y}N$ or $GaN/Al_yGa_{1-y}N$ as a pair of the quantum well layer and the barrier layer in the multiple quantum well active layer and shows laser action with a wavelength longer than 310 nm, the effect can be exhibited to the same extent or more.

Furthermore, phosphorus (P) is used as an element for making the acceptor level shallow and adjusting the lattice constant of the p-type leak barrier layer 16 and the p-type cladding layer 17 in this embodiment, but arsenic (As) can be used instead. In this case, the composition of As can be similar to that of P. Alternatively, phosphorus (P) and arsenic (As) can be used together.

Moreover, the multiple quantum well active layer 15 is provided with the n-type cladding layer 14 on its surface closer to the substrate 11 in this embodiment, which does not limit the invention. The multiple quantum well active layer 15 can be provided with the p-type cladding layer 17 on its surface closer to the substrate 11 and the n-type cladding layer 14 on the other surface farther from the substrate 11.

Embodiment 2

Embodiment 2 of the invention will now be described with reference to the accompanying drawings.

Figure 6A:
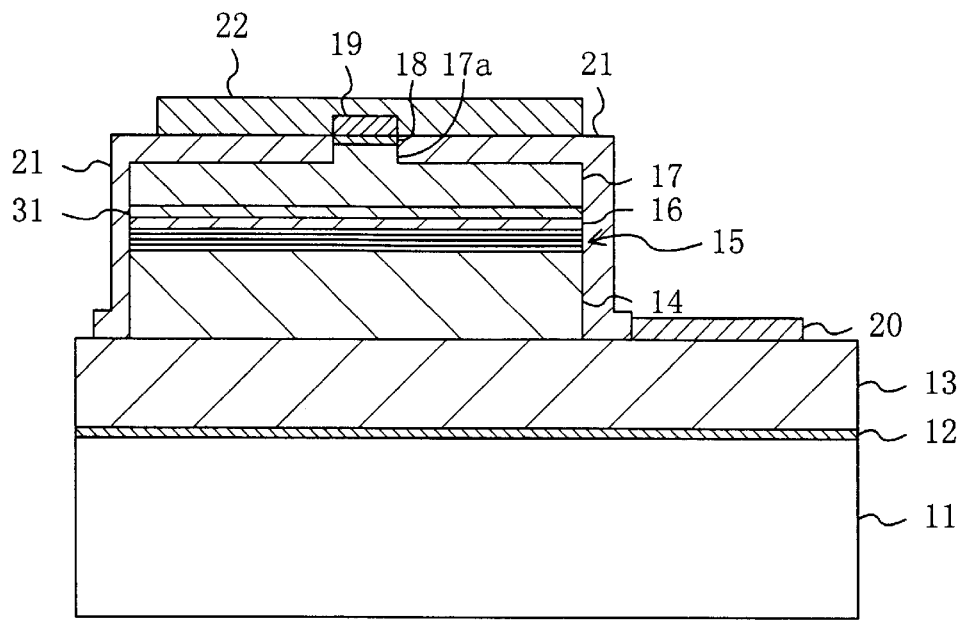
FIG. 6(a) is a sectional view for showing the structure of a semiconductor laser device according to Embodiment 2 of the invention.
Figure 6B:
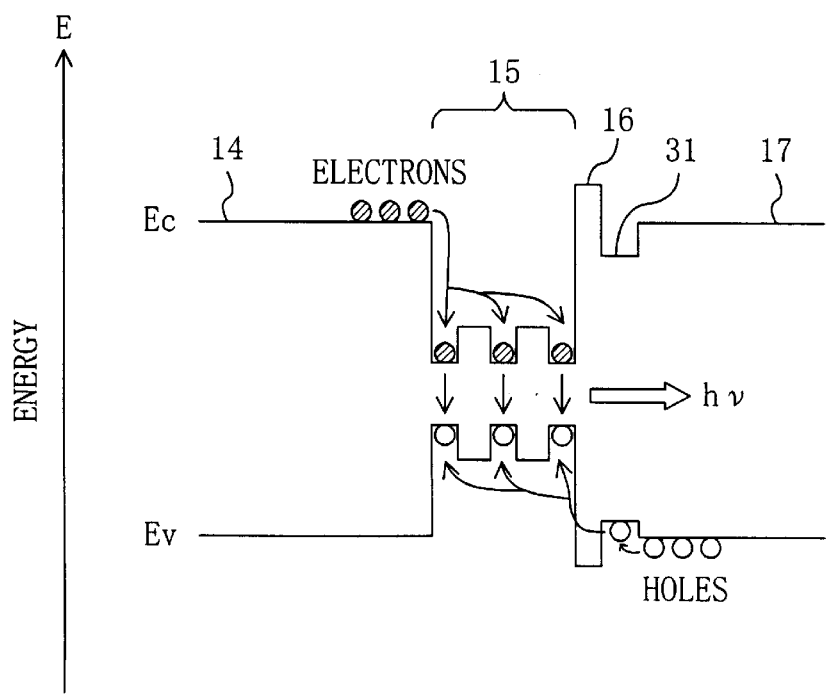
FIG. 6(b) is a diagram for showing an energy band in the vicinity of an active layer in the semiconductor laser device of Embodiment 2.

FIGS. 6(a) and 6(b) show a multiple quantum well type nitride semiconductor laser device according to Embodiment 2, wherein FIG. 6(a) shows the sectional structure thereof and FIG. 6(b) schematically shows an energy band in the vicinity of an active layer therein. In FIG. 6(b), Ec indicates an energy at the lower end of the conduction band of electrons, and Ev indicates an energy at the upper end of the valence band of electrons. Also, in FIG. 6(a), like reference numerals are used to refer to like elements shown in FIG. 1 so that the description can be omitted.

As is shown in FIG. 6(a), the semiconductor laser device of Embodiment 2 is characterized by a p-type carrier injection layer 31 of p-type $Al_{0.3}Ga_{0.7}N_{0.985}P_{0.015}$ that is formed between a p-type leak barrier layer 16 and a p-type cladding layer 17 and has an energy gap wider than that of a multiple quantum well active layer 15 and narrower than that of the p-type cladding layer 17.

Accordingly, similarly to Embodiment 1, by adding an appropriate amount of phosphorus (P) to the p-type cladding layer 17, the p-type carrier injection layer 31 and the p-type leak barrier layer 16 having an energy gap capable of confining produced light from the quantum well active layer 15 capable of emitting violet light, the energy Ev at the upper end of the valence band and the energy Ec at the lower end of the conduction band can be shifted to be higher with keeping a wide energy gap. In this manner, the acceptor levels in the respective p-type nitride semiconductor layers 16, 17 and 31 can be lowered, so as to increase the activation efficiency of holes in these semiconductor layers. As a result, a desired carrier concentration can be secured.

Also, the p-type leak barrier layer 16, which prevents electrons with high energy injected from an n-type cladding layer 14 from leaking to the p-type cladding layer 17 without contributing the laser action, is formed between the quantum well active layer 15 and the p-type cladding layer 17. Therefore, the recombination efficiency of recombining electrons and holes can be improved.

Furthermore, as is shown in FIG. 6(b), the p-type carrier injection layer 31 is formed between the p-type leak barrier layer 16 and the p-type cladding layer 17. Therefore, holes injected from the p-type cladding layer 17 once drop into the p-type carrier injection layer 31 having a lower energy against holes than the p-type cladding layer 17. After the high energy is thus slightly reduced, the holes are transmitted through the p-type leak barrier layer 16 by the tunnel effect to be injected into the quantum well active layer 15. As a result, the injection efficiency of the holes injected into the quantum well active layer 15 can be further improved, resulting in further decreasing the threshold current.

Also in this embodiment, arsenic (As) can be added instead of phosphorus (P) to the p-type leak barrier layer 16, the p-type cladding layer 17 and the p-type carrier injection layer 31, or phosphorus (P) and arsenic (As) can be together added.

Embodiment 3

Embodiment 3 of the invention will now be described with reference to the accompanying drawings.

Figure 7A:
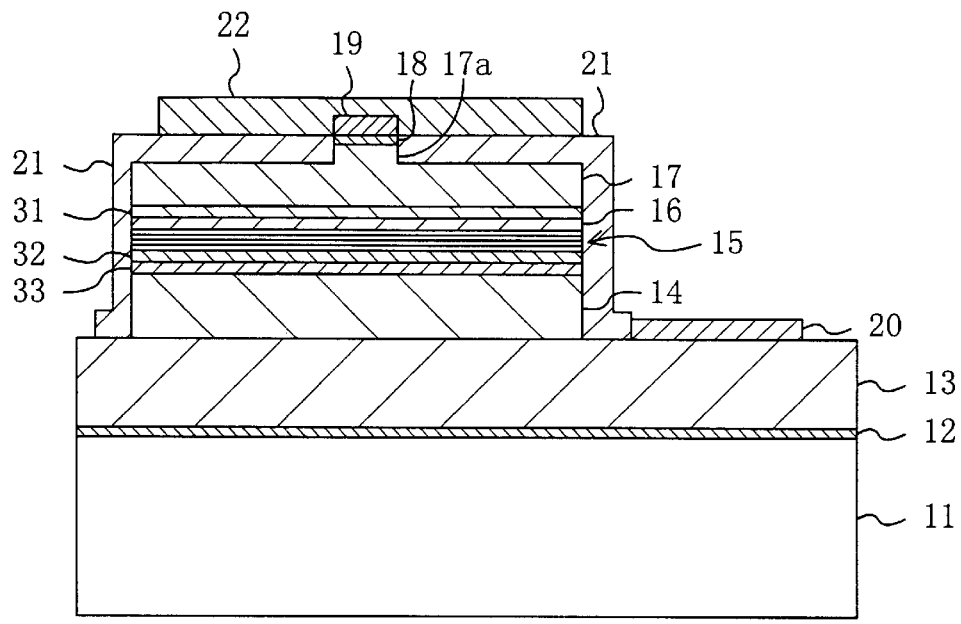
FIG. 7(a) is a sectional view for showing the structure of a semiconductor laser device according to Embodiment 3 of the invention.
Figure 7B:
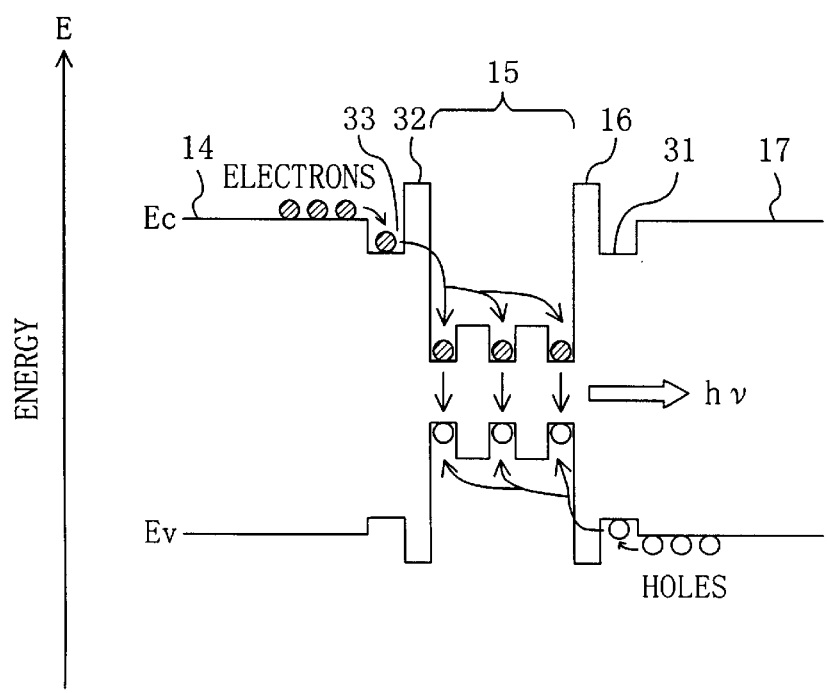
FIG. 7(b) is a diagram for showing an energy band in the vicinity of an active layer in the semiconductor laser device of Embodiment 3.
Figure 8:
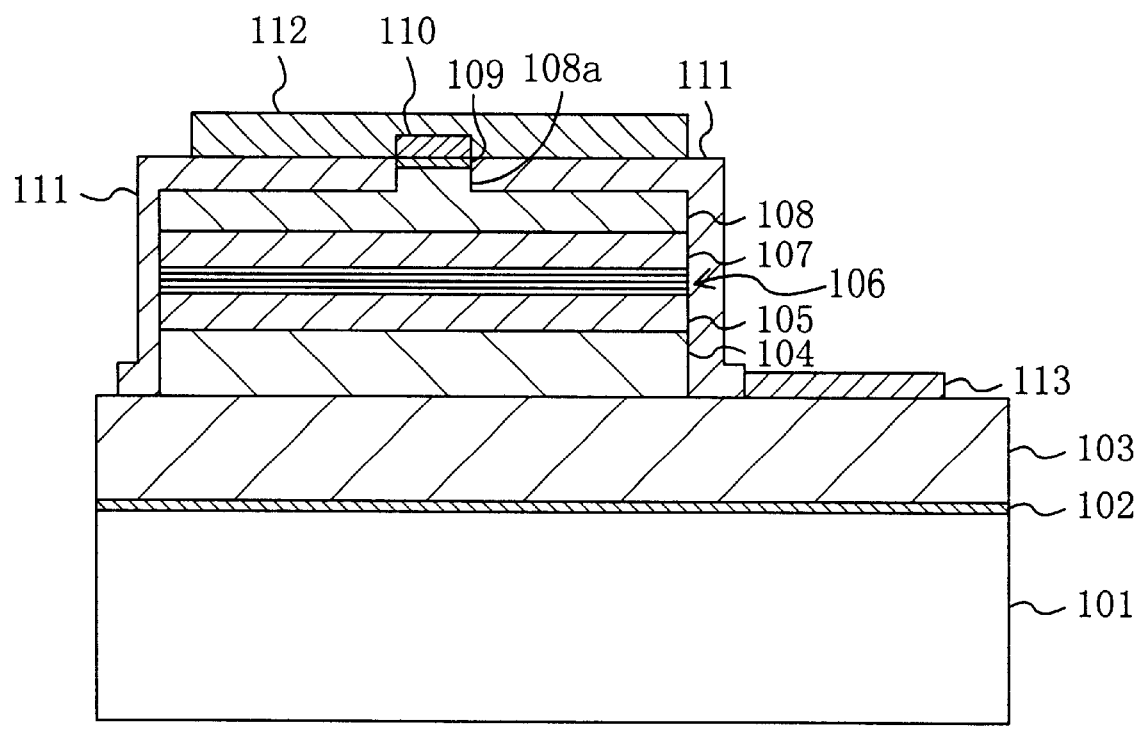
FIG. 8 is a sectional view for showing the structure of a conventional group III–V nitride semiconductor laser device.

FIGS. 7(a) and 7(b) show a multiple quantum well type nitride semiconductor laser device according to Embodiment 3, wherein FIG. 7(a) shows the sectional structure thereof and FIG. 7(b) schematically shows an energy band in the vicinity of an active layer therein. In FIG. 7(b), Ec indicates an energy at the lower end of the conduction band of electrons and Ev indicates an energy at the upper end of the valence band of electrons. Furthermore, in FIG. 7(a), like reference numerals are used to refer to like elements used in FIGS. 1 and 6(a), so that the description can be omitted.

As is shown in FIG. 7(a), the semiconductor laser device of Embodiment 3 comprises, in addition to the composing elements of the semiconductor laser device of Embodiment 2, an n-type leak barrier layer 32 of n-type $Al_{0.4}Ga_{0.6}N$ having a wider energy gap than a p-type cladding layer 17 and formed between a multiple quantum well active layer 15 and an n-type cladding layer 14; and an n-type carrier injection layer 33 of n-type $Al_{0.3}Ga_{0.7}N$ having an energy gap narrower than that of the n-type cladding layer 17 and wider than that of the quantum well active layer 15 and formed between the n-type leak barrier layer 32 and the n-type cladding layer 14.

Accordingly, similarly to Embodiments 1 and 2, by adding an appropriate amount of phosphorus (P) to the p-type cladding layer 17, the p-type carrier injection layer 31 and a p-type leak barrier layer 16 having a comparatively large composition ratio of aluminum (Al), the energy Ev at the upper end of the valence band and the energy Ec at the lower end of the conduction band can be shifted to be higher with keeping a wide energy gap. In this manner, the acceptor levels can be lowered in the respective p-type nitride semiconductor layers 16, 17 and 31, resulting in increasing the activation efficiency of holes in these semiconductor layers.

Furthermore, the semiconductor laser device of this embodiment includes, between the quantum well active layer 15 and the n-type cladding layer 14, the n-type leak barrier layer 32 for preventing holes with high energy injected from the p-type cladding layer 17 from leaking to the n-type cladding layer 14 without contributing laser action. Moreover, the semiconductor laser device includes, between the n-type leak barrier layer 32 and the n-type cladding layer 14, the n-type carrier injection layer 33 for once dropping electrons injected from the n-type cladding layer 14 and transmitting the electrons through the n-type leak barrier layer 32 by the tunnel effect to be injected into the quantum well active layer 15.

Accordingly, as compared with the semiconductor laser devices of Embodiments 1 and 2, the semiconductor laser device of this embodiment is more excellent in an efficiency of confining externally injected electrons and holes in the multiple quantum well active layer 15, and hence attains a further smaller threshold current and a further better temperature characteristic.

In this embodiment, the thickness of the n-type leak barrier layer 32 can be selected in a range that can reflect holes and transmit electrons, and is specifically 1 nm or more and 100 nm or less, and more preferably 10 nm or more and 30 nm or less.

As an example of the operation characteristic of the semiconductor laser device of this embodiment, it is confirmed that laser action with a wavelength of 315 nm starts at a threshold current of 60 mA and that a temperature for continuous operation is 80° C.

Although phosphorus (P) is not added to the respective n-type nitride semiconductor layers, that is, the n-type cladding layer 14, the n-type leak barrier layer 32 and the n-type carrier injection layer 33 in this embodiment, at least one of phosphorus (P) and arsenic (As) can be added thereto like the p-type nitride semiconductor layers. In this case, when, for example, phosphorus (P) is added, the n-type cladding layer 14 has a composition of n-type $Al_{0.4}Ga_{0.6}N_{0.98}P_{0.02}$, the n-type leak barrier layer 32 has a composition of n-type $Al_{0.5}Ga_{0.5}N_{0.975}P_{0.025}$, and the n-type carrier injection layer 33 has a composition of n-type $Al_{0.3}Ga_{0.7}N_{0.985}P_{0.015}$.

Furthermore, the semiconductor laser device can further include, between the multiple quantum well active layer 15 and the respective cladding layers 14 and 17, a light guiding layer having an energy gap wider than that of the multiple quantum well active layer 15 and narrower than those of the respective cladding layers 14 and 17.

What is claimed is:

1. A semiconductor laser device comprising:
   an n-type cladding layer of an n-type first nitride semiconductor formed on a substrate;
   an active layer, formed on said n-type cladding layer, of a second nitride semiconductor having a narrower band gap than said first nitride semiconductor;
   a p-type cladding layer, formed on said active layer, of a p-type third nitride semiconductor having a wider band gap than said second nitride semiconductor;
   a p-type barrier layer, formed between said active layer and said p-type cladding layer, of a p-type fourth nitride semiconductor having a wider band gap than said first nitride semiconductor; and
   a p-type carrier injection layer, formed between said p-type barrier layer and said p-type cladding layer, of a p-type fifth nitride semiconductor having a band gap wider than the band gap of said active layer and narrower than the band gap of said p-type cladding layer.

2. The semiconductor laser device of claim 1,
   wherein said p-type cladding layer includes phosphorus or arsenic.

3. The semiconductor laser device of claim 2,
   wherein said p-type cladding layer has a composition for attaining a lattice constant substantially according with a lattice constant of gallium nitride, a lattice constant of a nitride semiconductor layer formed on a surface of said active layer closer to said substrate, or a lattice constant of said substrate.

4. The semiconductor laser device of claim 1,
   wherein said p-type barrier layer includes phosphorus or arsenic.

5. The semiconductor laser device of claim 4,
   wherein said p-type barrier layer has a composition for attaining a lattice constant substantially according with a lattice constant of gallium nitride, a lattice constant of a nitride semiconductor layer formed on a surface of said active layer closer to said substrate, or a lattice constant of said substrate.

6. The semiconductor laser device of claim 1,
   wherein said p-type barrier layer has a thickness of 1 nm or more and 100 nm or less.

7. The semiconductor laser device of claim 1,
   wherein said active layer and said p-type barrier layer are adjacent to each other.

8. The semiconductor laser device of claim 1,
   wherein said p-type carrier injection layer includes phosphorus or arsenic.

9. The semiconductor laser device of claim 8,
   wherein said p-type carrier injection layer has a composition for attaining a lattice constant substantially according with a lattice constant of gallium nitride, a lattice constant of a nitride semiconductor layer formed on a surface of said active layer closer to said substrate, or a lattice constant of said substrate.

10. The semiconductor laser device of claim 1,
    wherein said active layer and said p-type barrier layer are adjacent to each other, and
    said p-type barrier layer and said p-type carrier injection layer are adjacent to each other.

11. A semiconductor laser device comprising:
    a p-type cladding layer of a p-type first nitride semiconductor formed on a substrate;
    an active layer, formed on said p-type cladding layer, of a second nitride semiconductor having a narrower band gap than said first nitride semiconductor;
    an n-type cladding layer, formed on said active layer, of an n-type third nitride semiconductor having a wider band gap than said second nitride semiconductor;
    a p-type barrier layer, formed between said p-type cladding layer and said active layer, of a p-type fourth nitride semiconductor having a wider band gap than said third nitride semiconductor; and a p-type carrier injection layer, formed between said p-type barrier layer and said p-type cladding layer, of a p-type fifth nitride semiconductor having a band gap wider than the band gap of said active layer and narrower than the band gap of said p-type cladding layer.

12. A semiconductor laser device comprising:

an n-type cladding layer of an n-type first nitride semiconductor formed on a substrate;

an active layer, formed on said n-type cladding layer, of a second nitride semiconductor having a narrower band gap than said first nitride semiconductor;

a p-type cladding layer, formed on said active layer, of a p-type third nitride semiconductor having a wider band gap than said second nitride semiconductor;

an n-type barrier layer having a wider band gap than said third nitride semiconductor and formed between said n-type cladding layer and said active layer;

an n-type carrier injection layer having a band gap narrower than the band gap of said first nitride semiconductor and wider than the band gap of said second nitride semiconductor and formed between said n-type cladding layer and said n-type barrier layer;

a p-type barrier layer having a wider band gap than said first nitride semiconductor and formed between said active layer and said p-type cladding layer; and a p-type carrier injection layer having a band gap narrower than the band gap of said third nitride semiconductor and wider than the band gap of said second nitride semiconductor and formed between said p-type barrier layer and said p-type cladding layer.

13. The semiconductor laser device of claim 12, wherein at least one of said n-type cladding layer and said p-type cladding layer includes phosphorus or arsenic.

14. The semiconductor laser device of claim 13, wherein at least one of said n-type cladding layer and said p-type cladding layer has a composition for attaining a lattice constant substantially according with a lattice constant of gallium nitride, a lattice constant of a nitride semiconductor layer formed on a surface of said active layer closer to said substrate, or a lattice constant of said substrate.

15. The semiconductor laser device of claim 12, wherein at least one of said n-type barrier layer and said p-type barrier layer includes phosphorus or arsenic.

16. The semiconductor laser device of claim 15, wherein at least one of said n-type barrier layer and said p-type barrier layer has a composition for attaining a lattice constant substantially according with a lattice constant of gallium nitride, a lattice constant of a nitride semiconductor layer formed on a surface of said active layer closer to said substrate, or a lattice constant of said substrate.

17. The semiconductor laser device of claim 12, wherein each of said n-type barrier layer and said p-type barrier layer has a thickness of 1 nm or more and 100 nm or less.

18. The semiconductor laser device of claim 12, wherein at least one of said n-type carrier injection layer and said p-type carrier injection layer includes phosphorus or arsenic.

19. The semiconductor laser device of claim 18, wherein at least one of said n-type carrier injection layer and said p-type carrier injection layer has a composition for attaining a lattice constant substantially according with a lattice constant of gallium nitride, a lattice constant of a nitride semiconductor layer formed on a surface of said active layer closer to said substrate, or a lattice constant of said substrate.

20. The semiconductor laser device of claim 12, wherein said active layer and said n-type barrier layer are adjacent to each other, and said n-type barrier layer and said n-type carrier injection layer are adjacent to each other.

21. The semiconductor laser device of claim 12, wherein said active layer and said p-type barrier layer are adjacent to each other, and said p-type barrier layer and said p-type carrier injection layer are adjacent to each other.

* * * * *